(12) United States Patent
Kim et al.

(10) Patent No.: US 7,078,314 B1
(45) Date of Patent: Jul. 18, 2006

(54) MEMORY DEVICE HAVING IMPROVED PERIPHERY AND CORE ISOLATION

(75) Inventors: Unsoon Kim, San Jose, CA (US); Hiroyuki Kinoshita, Sunnyvale, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/407,999

(22) Filed: Apr. 3, 2003

(51) Int. Cl.
*H01L 21/76* (2006.01)

(52) U.S. Cl. ........................ 438/427; 438/700
(58) Field of Classification Search ............... 438/266, 438/296, 424, 427, 435–437, 431, 524, 700
See application file for complete search history.

(56) References Cited

U.S. PATENT DOCUMENTS

| | | | |
|---|---|---|---|
| 6,265,292 B1 * | 7/2001 | Parat et al. | 438/524 |
| 6,406,976 B1 * | 6/2002 | Singh et al. | 438/423 |
| 6,624,022 B1 * | 9/2003 | Hurley et al. | 438/256 |

\* cited by examiner

*Primary Examiner*—David Vu

(57) ABSTRACT

The present invention discloses a memory device having an improved periphery isolation region and core isolation region. A first trench is formed in a core region. Substrate material bordering the first trench is then oxidized to form a first liner. The first liner is then removed. A second trench is then formed in a periphery region. A second oxidation is then performed such that a second liner is formed from the substrate material bordering the first and second trenches. A dielectric trench fill having substantially uniform density is then deposited in the first and second trenches.

11 Claims, 15 Drawing Sheets

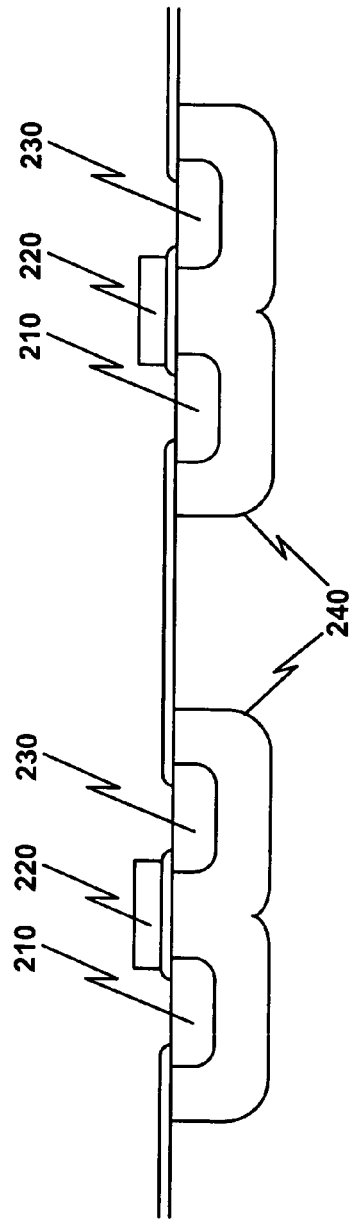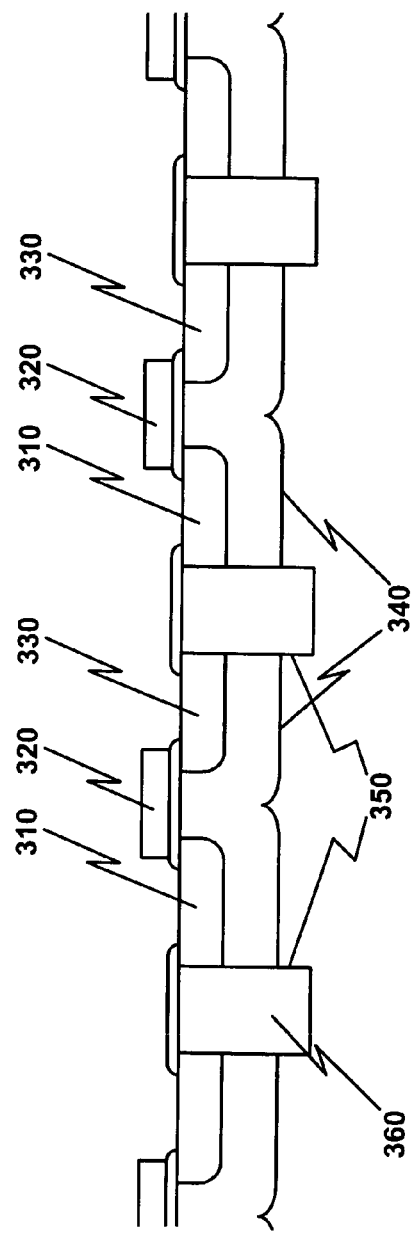

MEMORY DEVICE HAVING IMPROVED PERIPHERY AND CORE ISOLATION

FIELD OF THE INVENTION

Embodiments of the present invention relate to device isolation in integrated circuits, and more particularly to improved shallow trench isolation regions.

BACKGROUND OF THE INVENTION

Referring to prior art FIG. 1A, a wafer 100 used for fabricating a plurality of die 105 in accordance with the convention art is shown. A desired integrated circuit is typically fabricated on each die 105 on the wafer 100. Integrated circuits typically comprise periphery and core circuitry. For example, the periphery circuitry of a memory device comprises decoder logic, control logic and sense logic. The core circuitry of the memory device comprises an array of memory cells. As depicted in prior art FIG. 1B, each die 105 is typically fabricated to contain the periphery circuitry along the outer periphery region 110 of the die 105, and the core circuitry in the core region 120 of the die 105. The periphery 110 and the core 120 may be separated by an interface region 115. The interface region 115 may also contain isolation regions, circuitry, interconnects, and/or the like.

As semiconductor technology progresses, increasing device density and speed continues to be critical. Increasing density and speed may be achieved by scaling semiconductor devices. Increases in device scaling have resulted in the continued need to improve isolation regions between devices. Improved isolation regions should be narrower and/or deeper. The isolation regions should also have improved electrical insulating qualities.

Prior art FIGS. 2 and 3 illustrate why improving device isolation is required to continue to scale devices. In prior art FIG. 2, there are two device regions separated by a field region. For example, each device region has a transistor formed by a source 210, gate 220, and drain 230. Each device region encompasses the depletion regions resulting from the reverse-biased source-substrate and drain-substrate junctions. As long as the separation between the devices is greater than twice the maximum depletion layer width 240, isolation is maintained. However, for advanced processes with deep sub-micron feature sizes, this form of isolation prohibits sufficient scaling.

Prior art FIG. 3 illustrates a shallow trench isolation (STI) structure, which is currently used to provide isolation between devices. Shallow trench isolation allows further scaling and increased circuit density. For shallow trench isolation, the device region is masked, a trench is etched 350, and then the trench is filled with a dielectric 360, such as tetraethylorthosilicate (TEOS) formed oxide. A transistor having a source 310, gate 320, and drain 330 are formed between the shallow trench isolation regions. The dielectric 360 filled shallow trench 350 effectively cuts off and separates the depletion layers 340 of adjacent transistors, thus allowing the devices to be fabricated closer together.

Typically, the circuitry in the periphery region is fabricated with a lower component density than circuitry in the core region. Furthermore, the circuitry in the periphery region typically operates at a higher voltage level than circuitry in the core region. As a result, the trenches in the periphery region should be relatively deep. However, the relatively low circuit density allows for wide trenches. Thus, relatively large aspect ratio (depth of trench divided by width of trench) trenches are typically utilized in the periphery region.

On the other hand, the trenches can be relatively shallow in the core region. However, to achieve high circuit density, sufficiently narrow trenches are utilized. Thus, relatively small aspect ratio trenches are typically utilized in the core region. However, the minimum usable aspect ratio is limited by the ability to fill the trench with a dielectric. For example, when the aspect ratio of trenches is less than approximately 7.5 it is difficult to deposit dielectric material having uniform density in such trenches.

Furthermore, current trench forming techniques typically result in trenches having sharp corners. As the geometry of the trenches has continued to shrink, the sharp corners of the trenches suffer from corner effects, which can degrade performance in and/or cause failure of the integrated circuit. For example, an electric potential present across an isolation region produces a high electric field per unit area at the corners of the trench. Such a high electric field can produce leakage current or even oxide layer breakdown.

Accordingly, there is a continued need for improving the device isolation regions in integrated circuits having multiple trench isolation regions. What is needed is a means for depositing a trench fill having a uniform density in small aspect ratio device isolation trenches. Furthermore, the device isolation method should be adapted to reduce corner effects, such as leakage current, and the like. Embodiments of the present invention provide a novel solution to the above needs.

SUMMARY OF THE INVENTION

Embodiments of the present invention provide for a memory device having an improved periphery isolation region and core isolation region. Embodiments of the present invention provide for forming shallow trench isolation (STI) regions in both the periphery and core regions. Embodiments of the present invention also provide for a periphery trench having a first depth, and a core trench having a second depth. Embodiments of the present invention also provide for depositing a uniform density trench fill in a trench having a narrow aspect ratio. Embodiments of the present invention also provide for forming a liner oxide proximate a trench. Embodiments of the present invention also provide for rounding a corner of a trench. Embodiments of the present invention also provide for reducing corner effects and leakage current.

The present invention, in accordance with one embodiment, includes forming a first trench in a core region. Substrate material bordering the first trench is then oxidized to form a first liner. The first liner is then removed. A second trench is then formed in a periphery region. A second oxidation is then performed such that a second liner is formed from the substrate material bordering the first and second trenches. A dielectric trench fill having substantially uniform density is then deposited in the first and second trenches.

According to a second embodiment of the present invention, a first trench is formed in a periphery region. Substrate material bordering the trench is then oxidized to form a first liner. A second trench is then formed in a core region. A second oxidation is then performed such that a second liner is formed from the substrate material bordering the first and second trench. A dielectric trench fill having substantially uniform density is then deposited in the first and second trenches.

BRIEF DESCRIPTION OF THE DRAWINGS

The present invention is illustrated by way of example and not by way of limitation, in the figures of the accompanying drawings and in which like reference numerals refer to similar elements and in which:

Prior art

Prior art

Prior art FIG. 2 shows two device regions separated by a field region, in accordance with the conventional art.

Prior art FIG. 3 shows a shallow trench isolation (STI) structure, in accordance with the conventional art.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1A:
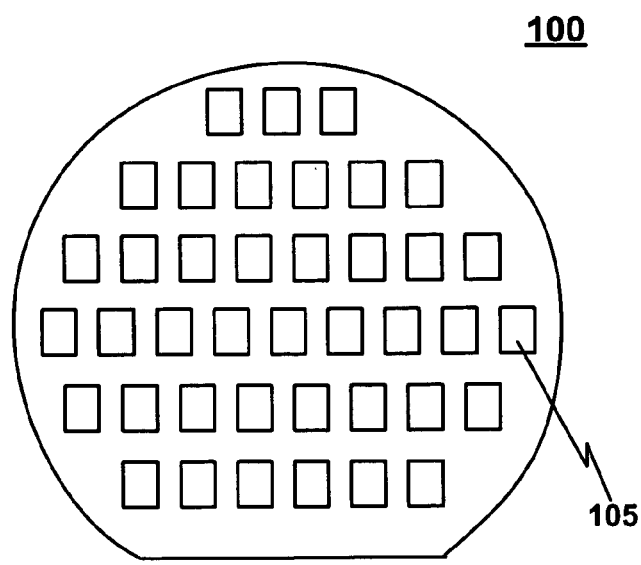
FIG. 1A shows a wafer used for fabricating a plurality of die, in accordance with the convention art.
Figure 1B:
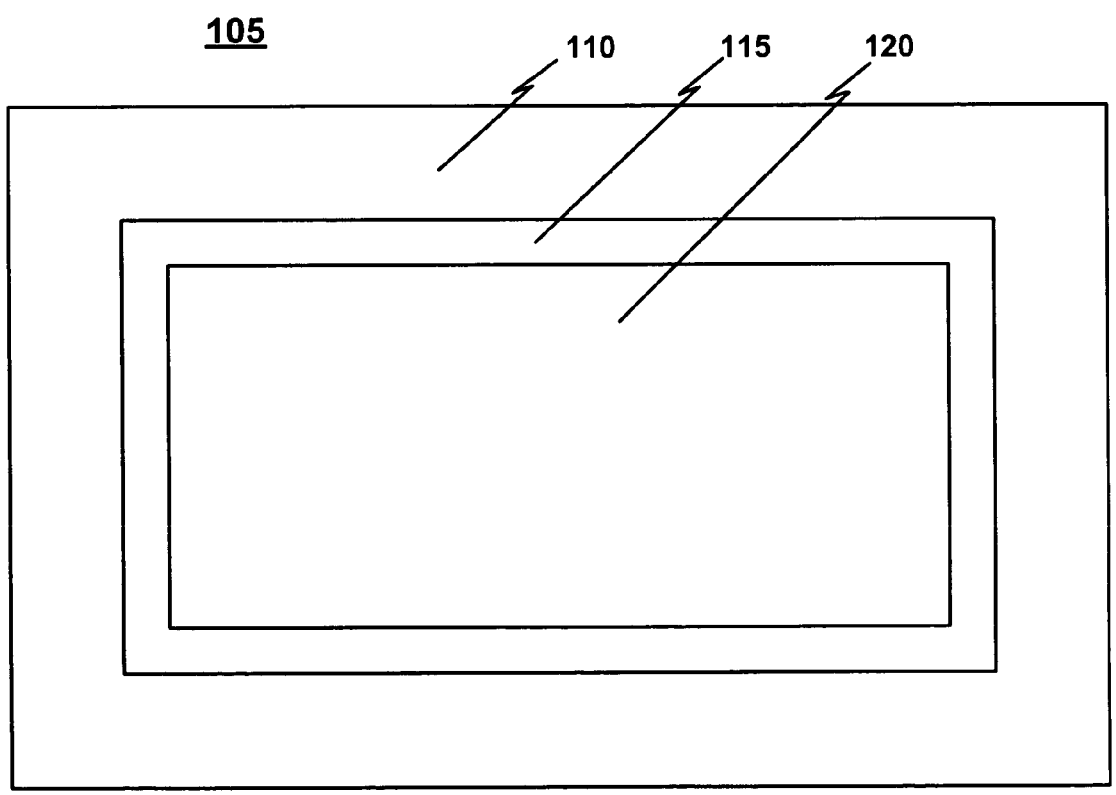
FIG. 1B shows a die containing a periphery region and a core region, in accordance with the convention art.
Figure 4A:
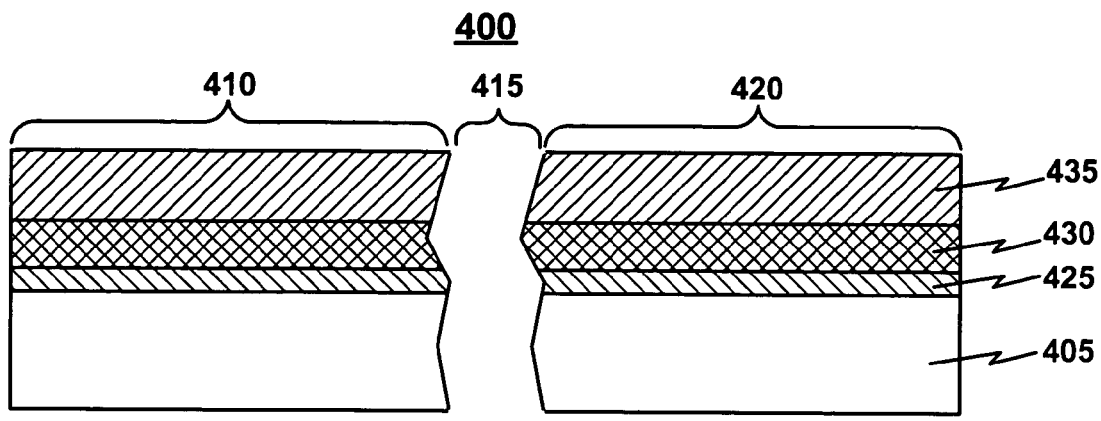
FIGS. 4A–4M show side sectional views of a wafer wherein core and periphery trench isolation structures are formed, in accordance with one embodiment of the present invention.

Referring now to FIGS. 4A–4M, side sectional views of a wafer 400 wherein core and periphery trench isolation structures are formed, in accordance with one embodiment of the present invention, is shown. As depicted in FIG. 4A, the wafer 400 is shown having three regions, a periphery region 410, an interface region 415, and a core region 420. A description of the interface region 415 is not necessary for an understanding of the present invention, and therefore is not shown or discussed in detail.

A pad oxide layer 425 is formed upon a substrate 405 of the wafer 400. In one implementation of the present embodiment, the pad oxide layer 425 is silicon dioxide ($SiO_2$) having a thickness of approximately 10–20 nanometers (nm). A barrier layer 430 is formed upon the surface of the pad oxide layer 425. In one implementation of the present embodiment, the barrier layer 430 is silicon nitride ($Si_3N_4$) having a thickness of approximately 100–200 nm. A first resist layer 435 is formed upon the surface of the barrier layer 430. The first resist layer 435 can be any well-known liquid light-sensitive polymer.

Figure 4B:
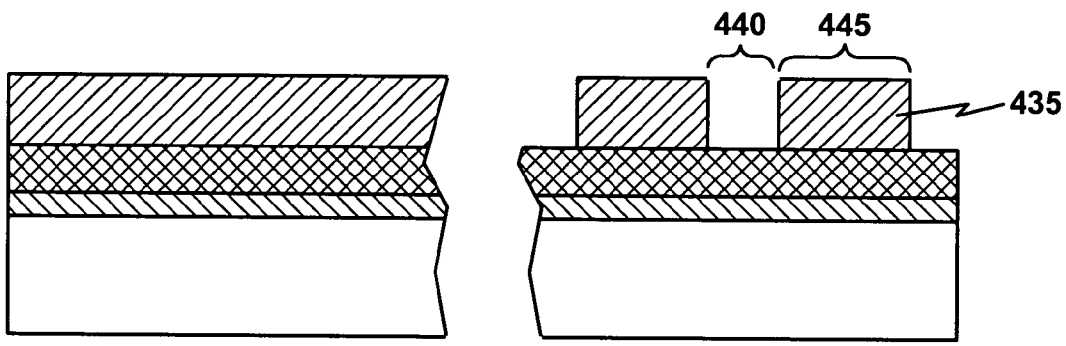

As depicted in FIG. 4B, the first resist layer 435 is patterned to define a core isolation region 440 and a core active region 445. The first resist layer 435 can be patterned by any well-known lithography process.

Figure 4C:
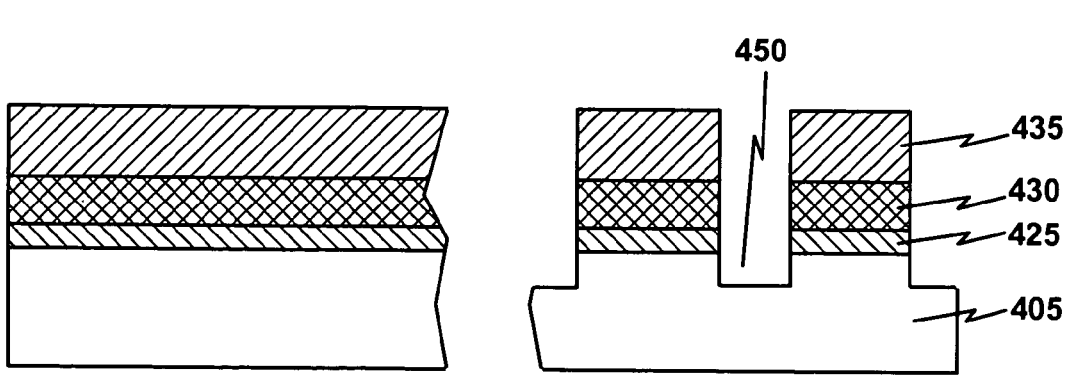

As depicted in FIG. 4C, the portions of the barrier layer 430, pad oxide layer 425, and substrate 405 left exposed by the patterned first resist layer 435 are removed to form a core isolation trench 450. Portions of the barrier layer 430, pad oxide layer 425, and substrate 405 can be removed by any well-known etching process. In one implementation, the resulting core isolation trench 450 is approximately 100–200 nm deep and 70–160 nm wide. In another implementation, the resulting core isolation trench 450 may be any desired depth and width.

Figure 4D:
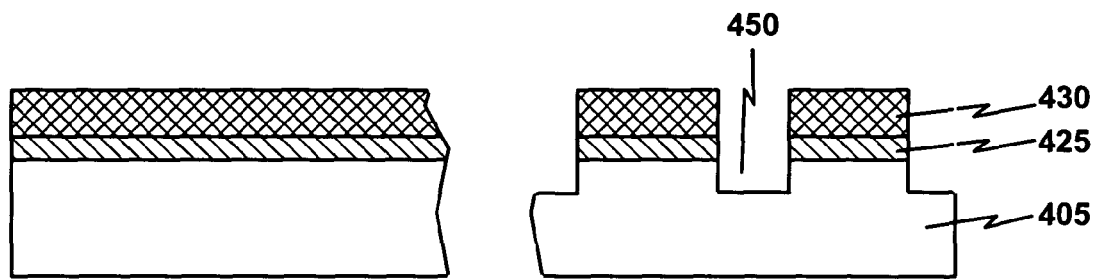

As depicted in FIG. 4D, the first resist layer 435 is removed. The first resist layer 435 can be removed by any well-known process such as resist stripping, or the like.

Figure 4E:
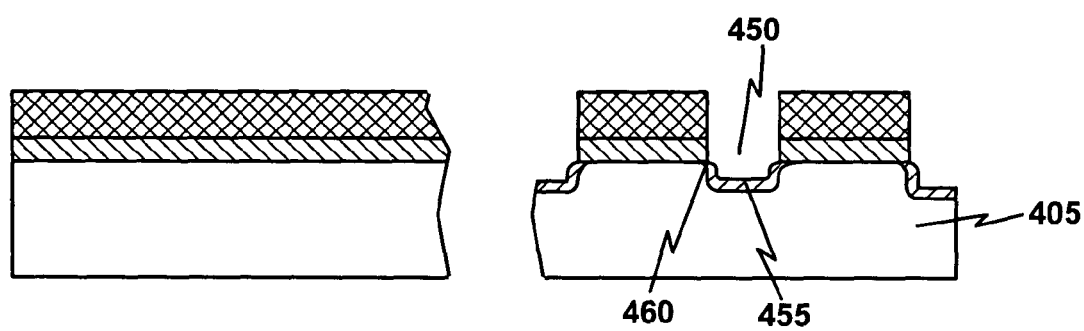

As depicted in FIG. 4E, a first liner oxide 455 is formed along the substrate 405 material bordering the core isolation trench 450. The first liner oxide 455 can be a dielectric formed by any well-known oxidation process. In one implementation the first liner oxide 455 forms approximately 50% above the material bordering the core isolation trench 450, and approximately 50% below the material 405 bordering the core isolation trench 450. In one implementation the first liner oxide 455 acts to round one or more corners 460 of the core isolation trench 450. The substrate at the corners along the opening of the trench, for example, has more surface area exposed to the oxidizing agent, than along the side walls of the trench. Therefore, the oxide layer grows quicker proximate the corners along the opening of the trench. Moving away from the corners at the opening, the oxidation rate decreases relative to the oxidation rate proximate the center of a side wall, thus forming a curved boundary of the substrate oxide junction proximate the top corner. On the other hand, the substrate at the corners along the bottom of the trench has less surface area exposed to the oxidizing agent than the top corners. Therefore, the oxide layer grows slower proximate the corners along the bottom of the trench, thus forming a curved boundary of the substrate oxide junction proximate the bottom corner of the trench.

In one implementation, the substrate 405 is silicon (Si), the oxidizing agent is oxygen (0), and the resulting liner oxide 455 is silicon dioxide ($SiO_2$) having a thickness of approximately 10–20 nm. In another implementation, the first liner oxide 455 may be any desired thickness.

Figure 4F:
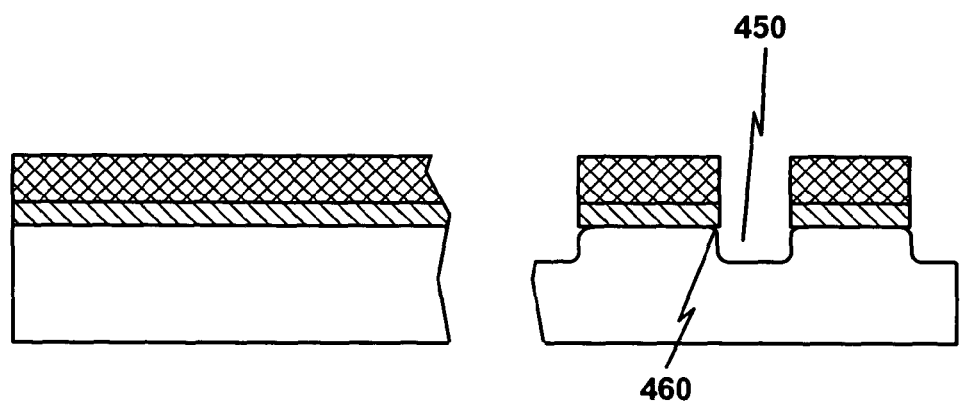

In a first configuration, as depicted in FIG. 4F, the first liner oxide 455 is removed. The first liner oxide 455 can be removed by any well-known sacrificial oxide etching process, such as wet etching. In one implementation, the resulting isolation trench 450 will have rounded corners 460. In one implementation, removing the first liner oxide may increase the width of the trench 450 by approximately 10–20 nm and the depth by 5–10 nm. Thus, the aspect ratio (the depth of trench divided by the width of the trench) of the core trench 450 may be increased slightly. In a second configuration, the first liner oxide 455 is not removed.

Figure 4G:
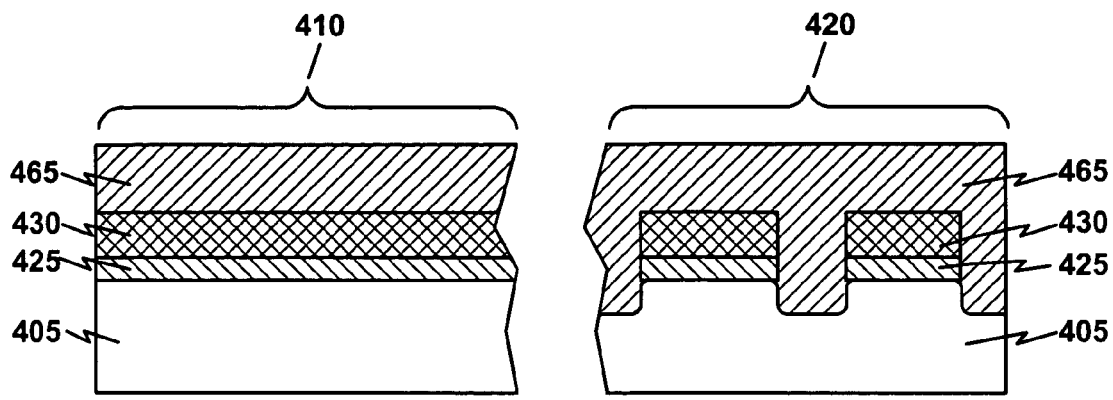

As depicted in FIG. 4G, a second resist layer 465 is formed upon the surface of the periphery region 410 and the core region 420. The second resist layer 465 can be any well-known liquid light-sensitive polymer.

Figure 4H:
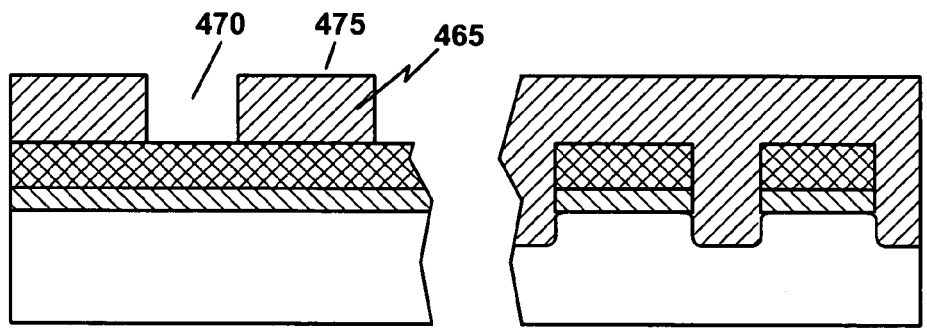

As depicted in FIG. 4H, the second resist layer 465 is patterned to define a periphery isolation region 470 and a periphery active region 475. The second resist layer 465 can be patterned by any well-known lithography process.

Figure 4I:
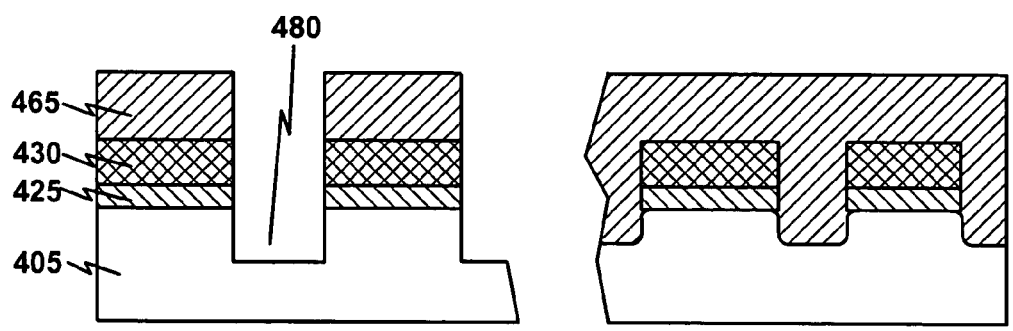

As depicted in FIG. 4I, the portions of the barrier layer 430, pad oxide layer 425, and substrate 405 left exposed by the patterned second resist layer 465 are removed to form a periphery isolation trench 480. Portions of the barrier layer 430, pad oxide layer 425, and substrate 405 can be removed by any well-known etching process. In one implementation the resulting periphery isolation trench 480 is approximately 200–400 nm deep and 160–320 nm wide. In another implementation, the resulting periphery isolation trench 480 may be any desired depth and width. Furthermore, the periphery isolation trench 480 may readily be fabricated to have a different depth than the core isolation trench 450.

Figure 4J:
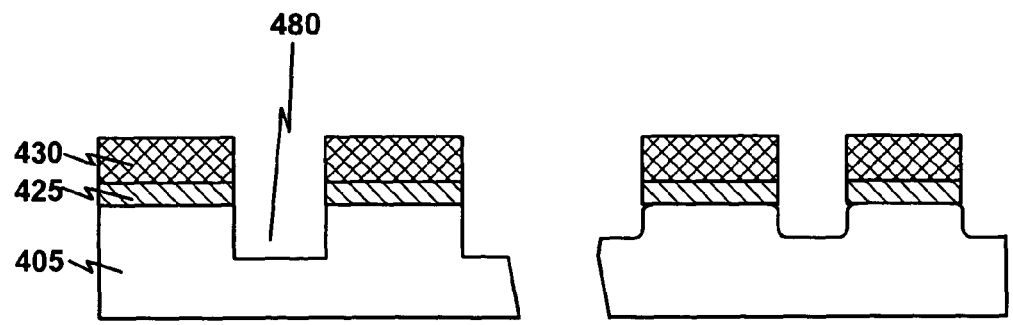

As depicted in FIG. 4J, the second resist layer 465 is removed. The second resist layer 465 can be removed by any well-known process such as resist stripping, or the like.

Figure 4K:
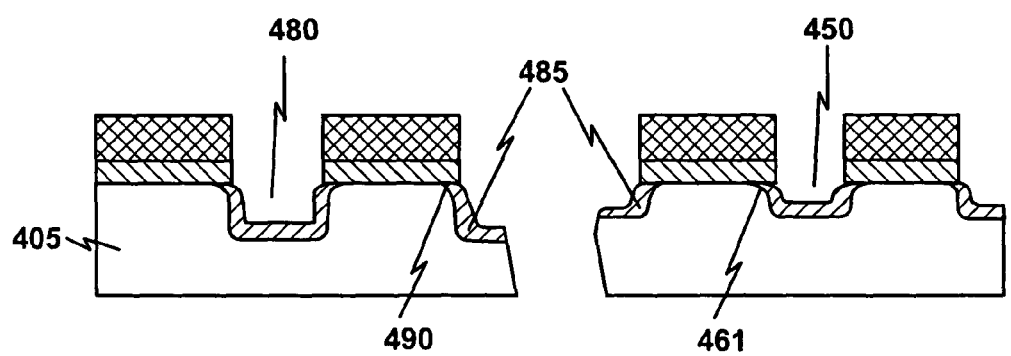

As depicted in FIG. 4K, a second liner oxide 485 is formed along the substrate 405 material bordering the periphery isolation trench 480 and the core isolation trench 450. The second liner oxide 485 can be a dielectric formed by any well-known oxidation process. In one implementation, the second liner oxide 485 acts to round the corners 490 of the periphery isolation trench 480. The second liner oxide 485 also acts to double round the corners 461 of the core isolation trench 450. In one implementation the second liner oxide 485 acts to provide a high quality insulating dielectric. In the first configuration of the present embodiment, the second liner oxide 485 is silicon dioxide ($SiO_2$) having a thickness of approximately 20–40 nm. In the second configuration, the second liner oxide 485 is approximately 20–40 nm thick in the periphery isolation trench, and combines with the first liner oxide in the core isolation trench to provide a total thickness of approximately 30–60 nm therein, or any relative combination of thicknesses.

Figure 4L:
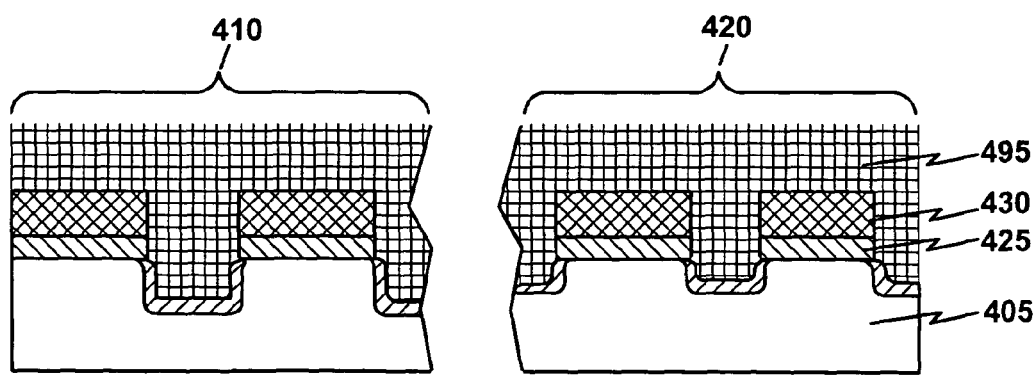

As depicted in FIG. 4L, a trench fill 495 is deposited in the periphery region 410 and the core region 420. The trench fill 495 can be formed by any well-known dielectric deposition process having good conformal coating properties. In one implementation of the present invention, the trench fill 495 can be formed by decomposition of tetraethylorthosilicate (TEOS) deposition. In another implementation, the trench fill 495 can be formed by high density plasma (HDP) deposition.

Figure 4M:
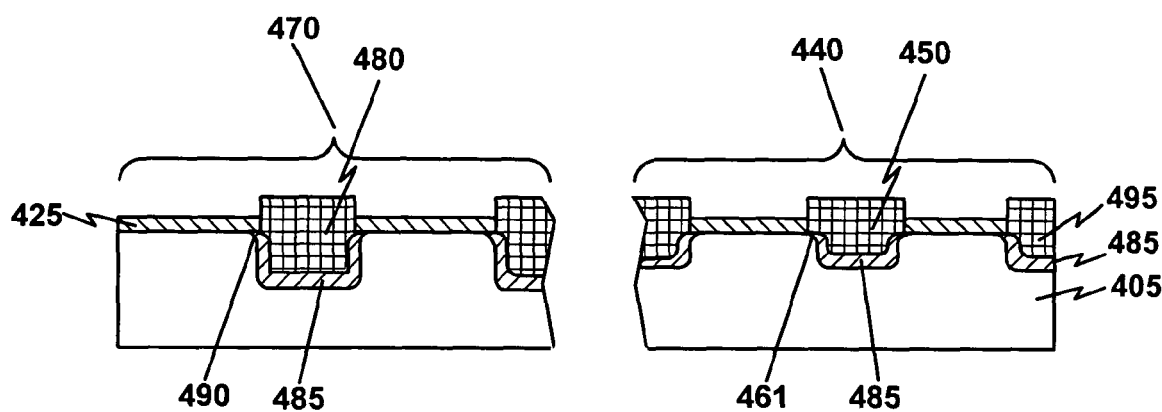

As depicted in FIG. 4M, the excess trench fill 495 and the barrier layer 430 may then be removed. The excess trench fill 495 and the barrier layer 430 can be removed by any well-known processes, such as a conventional wet nitride strip process, after chemical mechanical polishing (CMP), and/or the like.

As a result, the core isolation region 440 comprises the core trench 450, the second liner oxide 485 (and optionally the first liner oxide 455) providing double corner rounding 461, and having uniform density trench fill 495 therein. The periphery isolation region 470 comprise the periphery trench 480, the second liner oxide 485 providing corner rounding 490, and trench fill 495 having uniform density therein.

The rounded corners 461, 490 of the periphery 480 and core 450 trenches reduce corner effects therein. The rounded corners 461, 490 increases the localized area over which an electric field is distributed. Thus, reducing the chance of breakdown due to high localized electric field typically present at the corners 461, 490 of the periphery isolation trench 480 and the core isolation trench 450.

Trench fill having uniform density is difficult to obtain in conventionally formed trenches having aspect ratios of 7.0–8.0 or less. When the trench is very narrow, bubbles, holes, voids and other inconsistencies occur in the dielectric deposited in the trench. However, the double corner rounded 461 core isolation trench 450, provided by the present embodiment, allows for more uniform trench filling 495 therein. The trench fill process typically deposits dielectric material at a faster rate near the top of the trench as compared with the rate at the bottom of the trench. Therefore, the trench fill near the top of the trench acts to pinch off the trench fill before the bottom of the trench is completely filled. The double rounded corners act to increase the width of the trench at the top of the trench, thus reducing the pinch off effect.

The resulting trench fill 495 having uniform density provides a shallow trench isolation region 440, 470 having a good quality dielectric, which reduces leakage current effects. Furthermore, the double corner rounding 461 allows for use of a thinner second liner oxide layer 485, than is utilized in the conventional art. The double corner rounding 461 reduces corner effects, thus, reducing the need for a thick high quality dielectric layer as provided by the conventional art liner oxide layer. Such a reduced second liner oxide 485 thickness, and thus wider trench, further improves the ability to fill the core trench 450 with a dielectric 495 having a uniform density.

Figure 5A:
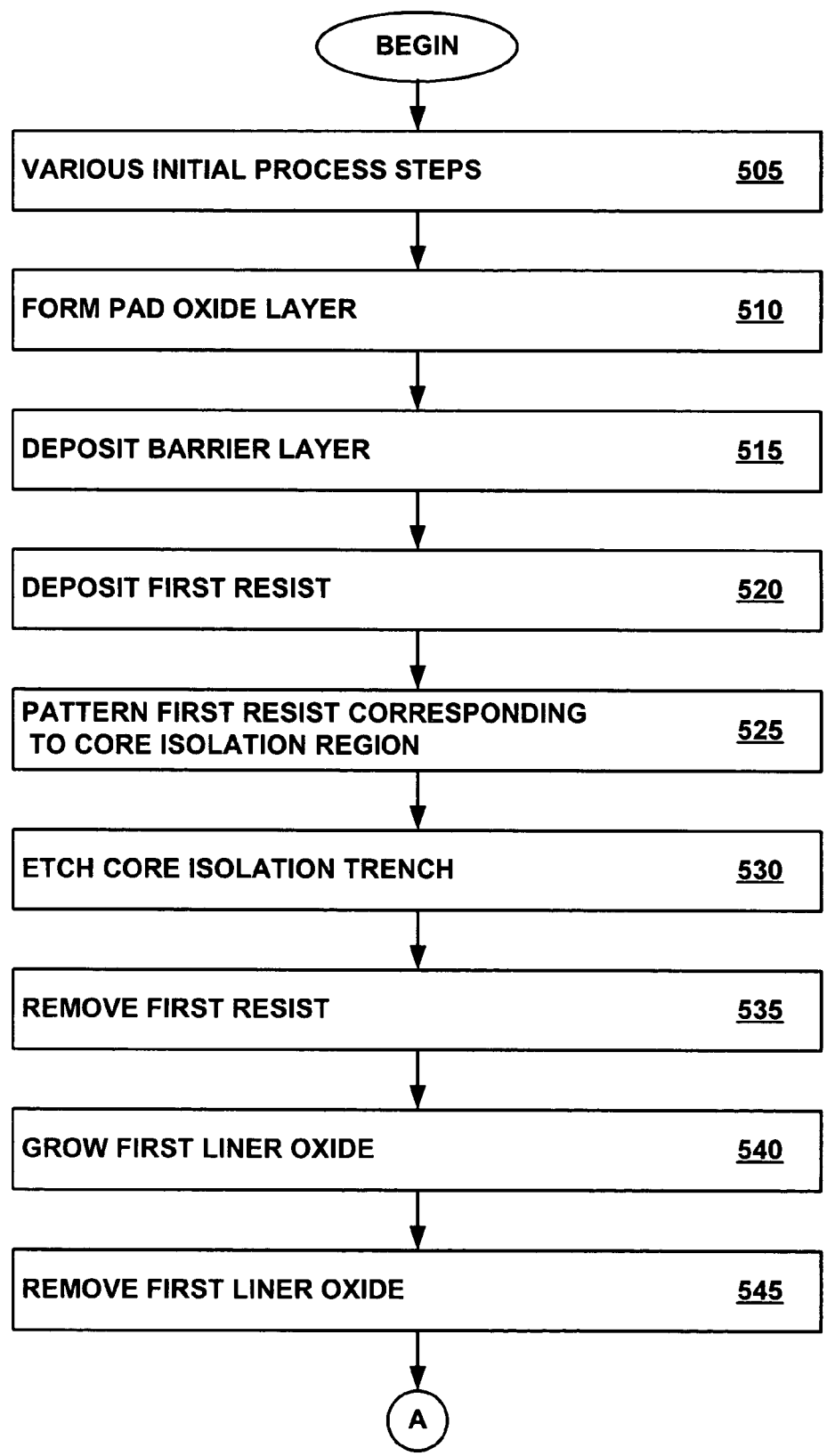
FIGS. 5A–5B show a method of fabricating a multiple trench isolation structure, according to one embodiment of the present invention.
Figure 5B:
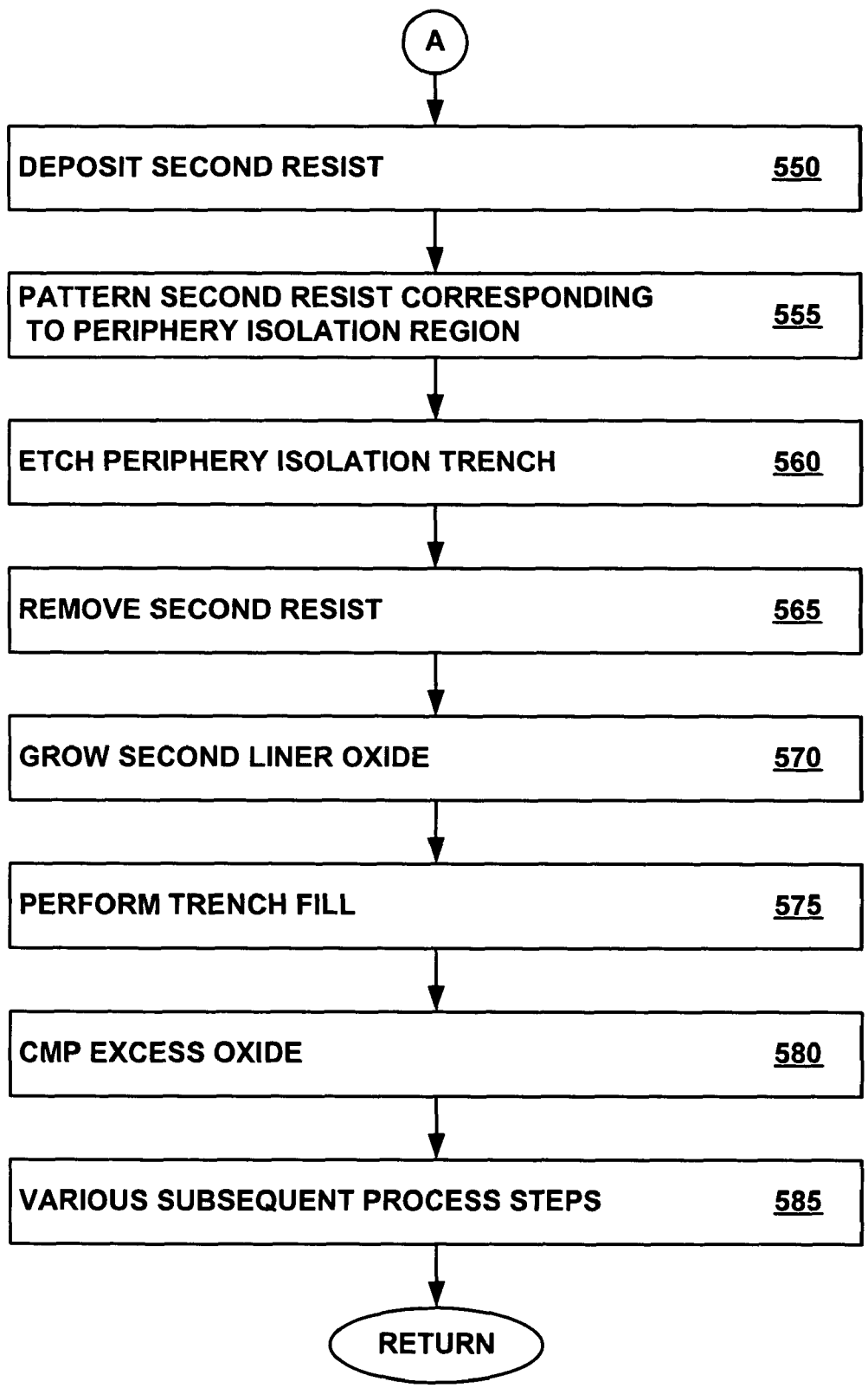

Referring now to FIGS. 5A–5B, a method of fabricating a multiple trench isolation structure, according to one embodiment of the present invention, is shown. The multiple trench isolation structure is utilized to provide isolation for devices in the core region and devices in the periphery region of an integrated circuit. In one implementation, the integrated circuit may be a flash memory device having an array of memory cells comprising the core region, and periphery circuits, such as decoder logic, control logic, sense amplifiers and the like, comprising the periphery region.

Typically, the periphery circuitry operates at higher voltage levels, than core circuitry, and therefore requires deeper and/or wider isolation regions. The core circuitry typically operates at lower voltage levels, but is densely fabricated, and therefore requires narrower and/or shallower isolation regions. However, the aspect ratio (width of the trench divided by the depth of the trench), of both periphery and core trenches, is limited by the ability to fill the trench with a desired dielectric having a uniform density.

As depicted in FIGS. 5A–5B, the process begins with various initial steps performed on a substrate, at step 505. The initial steps may include processes such as cleaning, impurity implanting, diffusion, and the like.

Next, at step 510, the present embodiment forms a pad oxide layer on the substrate. The pad oxide layer acts to protect portions of the substrate during various steps. In various implementations of the present embodiment, the pad oxide can be formed by any well-known oxidation, deposition, or the like process. In one implementation of the present embodiment, the substrate is silicon (Si), the oxidizing agent is oxygen (O), and the resulting pad oxide layer is silicon dioxide ($SiO_2$), having a thickness of approximately 10–20 nm.

Next, at step 515, the present embodiment deposits a barrier layer on the pad oxide layer. The barrier layer acts as an oxidation barrier and/or polishing stop. In one implementation of the present embodiment, the barrier layer can be formed by any well-known deposition process, such as chemical vapor deposition (CVD), or the like. The CVD process typically entails reaction of gaseous compounds in a reaction chamber, whereby the desired material comprising the barrier layer is deposited directly from the gas phase onto the surface of the pad oxide layer. In one implementation of the present embodiment, the barrier layer is silicon nitride ($Si_3N_4$), approximately 100–200 nm thick.

Next, at step 520, the present embodiment deposits a first resist layer on the barrier layer. The first resist can be any well-known light-sensitive polymer. In one implementation of the present embodiment, the first resist layer can be formed by applying a few drops of a liquid light-sensitive polymer on a rapidly spinning surface of the barrier layer, and then allowing the resist to dry.

Next, at step 525, the present embodiment patterns the first resist layer based upon the desired layout of a core isolation region. In one implementation of the present embodiment, the first resist can be patterned utilizing any well-known lithography process. Typically in lithography, a mask is placed over the resist. The mask contains a pattern of transparent and opaque areas corresponding to the desired core isolation region. The first resist is then exposed to ultraviolet or near-ultraviolet light through the transparent portions of the mask. For a negative resist, the molecules of the resist are polymerized (cross-linked) in areas exposed to the light. For a positive resist, molecular bonds are broken where the resist is illuminated. The unexposed portions of the resist remain unaffected. The unpolymerized areas of the first resist are then selectively dissolved in a chemical wash, thereby forming a patterned resist corresponding to the desired core isolation region.

Next, at step 530, the pad oxide layer, barrier layer, and substrate are selectively removed to form a core isolation trench. The pad oxide layer, barrier layer, and substrate can be selectively removed by any well-known etching process, such as dry etching, or the like. Etching removes material wherever the material is left exposed by the patterned resist. In one implementation of the present embodiment, the core isolation trench is formed by plasma etching. In plasma etching, the wafer surface is exposed to a plasma, which is an almost neutral mixture of energetic molecules, ions, and electrons that have been excited by radio frequency or microwave energy. The excited species interact chemically with the exposed portions of the barrier layer, pad oxide layer, and substrate, thereby allowing the ions to knock away atoms in the layers exposed by the patterned resist. In one implementation of the present embodiment, the etching process is performed until a core trench having an aspect ratio of approximately 7.0–8.0 or less is formed in the substrate.

Next, at step 535, the first resist layer is removed. The first resist layer/can be removed by any well-known method such as resist stripping, or the like. Typically in resist stripping, any well-known resist stripper is applied. The resist stripper causes the resist to swell and lose adhesion to the surface upon which it is applied.

Next, at step 540, a first liner oxide is grown in the core isolation trench. The first liner oxide can be grown by any well-known oxidation process. Typically in oxidation, the wafer is exposed to an oxidizing agent in a reaction chamber. In one implementation, the oxidation agent reacts with and consumes the substrate material along the core isolation trench walls, whereby the liner oxide is formed approximately half above the original substrate surface and half below the original substrate surface bordering the core isolation trench. In one implementation, the first liner oxide process acts to round the corners of the core isolation trench. In one implementation of the present embodiment, the substrate is silicon (Si), the oxidation agent is oxygen (O), and the resulting liner oxide is silicon dioxide ($SiO_2$) having a thickness of approximately 10–20 nm. For such an oxidation process performed in a dry ambient at approximately 900–1100° Celsius (C.), it takes approximately 4–6 minutes (min) to form the 10–20 nm thick first liner oxide layer of silicon dioxide.

Next, at optional step 545, the first liner oxide layer may be removed. The first liner oxide may be removed by any well-known sacrificial oxide etch process, such as wet etching. In one implementation, the resulting core trench may have rounded corners. In one implementation, removing the first liner oxide may also increases the aspect ratio of the core isolation trench.

Next, at step 550, the present embodiment deposits a second resist layer on the surface of the periphery region and core region. The resist can be any well-known light-sensitive polymer.

Next, at step 555, the present embodiment patterns the second resist layer based upon the desired layout of a periphery isolation region. In one implementation, the resist can be patterned utilizing any well-known lithography process.

Next, at step 560, the pad oxide layer, barrier layer, and substrate are selectively removed to form a periphery isolation trench. The pad oxide layer, barrier layer, and substrate can be selectively removed by any well-known etching process, such as dry etching, or the like. In one implementation of the present embodiment, the etching process is performed until a periphery isolation trench having an aspect ratio of approximately 7.0–8.0 or more is formed in the substrate.

Next, at step 565, the second resist layer is removed. The second resist layer can be removed by any well-known method such as resist stripping, or the like.

Next, at step 570, a second liner oxide is grown. The second liner oxide can be grown by any well-known oxidation process. In one implementation of the present embodiment, the oxidation agent reacts with and consumes the substrate material along the periphery isolation trench walls and the core isolation trench walls, whereby the liner oxide is formed approximately half above the original substrate surface and half below the original substrate surface bordering the periphery isolation trench and the core isolation trench. In one implementation, the second liner oxide process acts to round a corner of the periphery isolation trench. The second liner oxide process also acts to further round the corners of the core isolation trench. In one implementation of the present embodiment, the substrate is silicon (Si), the oxidation agent is oxygen (O), and the resulting second liner oxide is silicon dioxide (SiO2).

If optional step 540 is performed, the second liner oxide layer may be thinner than the conventional art liner oxide thickness. The double corner rounding reduces corner effects and therefore a thinner liner oxide may be untilized. Thus, the second liner oxide can be approximately 20–40 nm thick in both the periphery and core isolation trenches. For such an oxidation process performed in a dry ambient at approximately 900–1100° C.

If the first liner oxide is not removed, the second liner oxide can be approximately 20–40 nm in the periphery isolation trench and approximately 30–60 nm in the core isolation trench. For such an oxidation process performed in a dry ambient at approximately 900–1100° C. The second liner oxide layer combines with the first liner oxide layer in the core region in order to provide the 30–60 nm thick layer. Thus, no additional time is required to provide a double-thick liner oxide layer in the core trench.

Next, at step 575, a dielectric trench fill process, providing good conformal coverage, is performed. The rounded trench corners provided by steps 540 and/or 570 result in the dielectric as deposited having substantially uniform density. The trench fill process can be any well-known dielectric deposition process, such as TEOS, HDP, or the like. In one implementation of the present embodiment, the trench fill is provided by a TEOS process. TEOS formed dielectric results from the decomposition of tetraethylorthosilicate in a chemical vapor deposition (CVD) system, as follows:

$Si(OC_2H_5)_4 \rightarrow SiO_2 + byproducts$

In another implementation of the present embodiment, the trench fill is provided by a HDP process. The HDP formed dielectric results from the combination of:

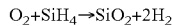

$O_2 + SiH_4 \rightarrow SiO_2 + 2H_2$ in a CVD system.

Next, at step 580, excess dielectric material deposited by the trench fill process is removed. In one implementation of the present embodiment, the excess dielectric material can be removed by any well-known CMP process. The CMP process typically entails removing material with an abrasive pad in the presence of chemical slurry.

Finally, at step 585, fabrication proceeds with various subsequent processing steps. The subsequent processing steps may include processes such as etching, impurity implanting, diffusion, deposition, etching, metalization, passivation, cleaning, polishing, and/or the like.

In one implementation, the first and second liner oxide material are comprised of a high quality dielectric material, as compared to the trench fill material. Therefore, the first and/or second liner oxide layers provide for increased isolating qualities of the core and periphery isolation regions. In one implementation, tf the first liner oxide is not removed, the second liner oxide layer combines with the first liner oxide layer in the periphery trench, thereby increasing the electrical isolating properties of the periphery isolation region. However, in the conventional art, where the two liner oxide layers are formed independent of each other, longer oxidation time is required. The additional time required in the conventional art, to form both oxide layers separately, thus adds to the total cost of manufacturing such integrated circuits.

In one implementation, the first and second liner oxide layers are also utilized to round the corners of the dual trench structure, thereby reducing corner effects. Such corner effects can result in degraded performance and/or device failure within the integrated circuit.

In one implementation, the rounded corners of the trenches also allow for depositing trench fill having substantially uniform density, particularly in trenches with aspect ratios of less than approximately 7.0–8.0. If optional step 540 is performed, the removal of the first liner oxide also acts to slightly enlarge the aspect ratio of the core isolation trench. Thus, further enhancing the ability to deposit trench fill having substantially uniform density in the core isolation trench. The resulting trench fill, having a uniform density, improves the insulating qualities of the core and/or periphery isolation regions. In one implementation, the substantially uniform density of the deposited dielectric may also reduce or eliminate the need for a trench fill densification process.

In the conventional art method, a trench fill densification process typically entails a thermal anneal process in which the wafer is subjected to an elevated temperature for a period of time (e.g., 1000° C. or more, for approximately 1–3 hours (h)). The thermal anneal process used in the conventional art method is disadvantageous in that the extra process and the additional time required increases the manufacturing costs. Furthermore, the elevated temperature utilized in the thermal anneal can result in undesirable diffusion of impurities, thus effecting doping profiles.

In addition, the core and periphery trenches are formed by a sequence of integrated steps. Thus, the complexity, time and cost of fabricating the isolation regions is reduced.

The above-described embodiments of the present invention are directed toward trench isolation regions comprising a core trench and a periphery trench. Generally, the periphery trench is deeper than the core trench. The core trench and a first liner oxide is formed prior to forming the periphery trench and second liner oxide layer. As a result the core trench has double rounded corners.

The below-described embodiments of the present invention are directed toward alternative trench isolation regions. Generally, the trench isolation region comprises a periphery trench having a first depth and a core trench having a second depth. The periphery trench and first liner oxide is formed prior to forming the core trench and second liner oxide. As a result the periphery trench has double rounded corners.

Figure 6A:
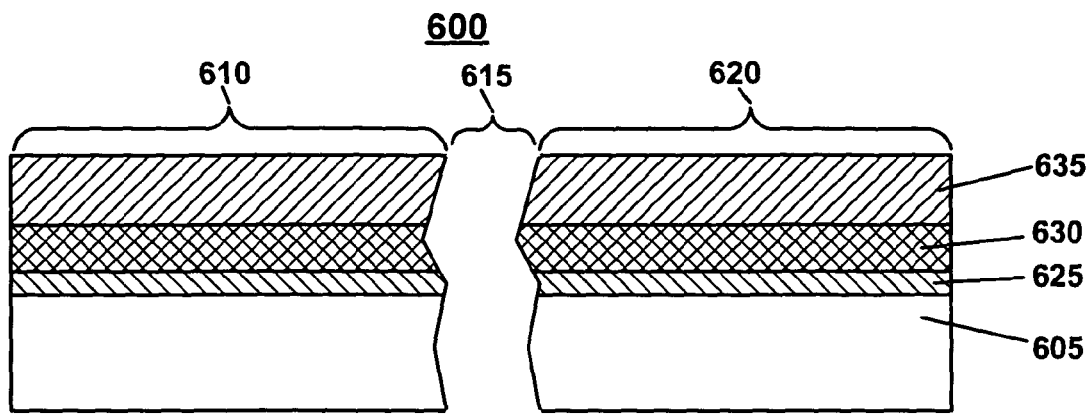
FIGS. 6A–6L show side sectional views of a wafer wherein core and periphery trench isolation structures are formed, according to one embodiment of the present invention.

Referring now to FIGS. 6A–6L, side sectional views of a wafer 600 wherein core and periphery trench isolation structures are formed, according to one embodiment of the present invention, is shown. As depicted in FIG. 6A, the wafer 600 is shown having three regions, a periphery region 610, an interface region 615, and a core region 620. A description of the interface region 615 is not necessary for an understanding of the present invention, and therefore is not shown or discussed in detail, so as not to unnecessarily obscure aspects of the present invention.

A pad oxide layer 625 is formed upon a substrate 605 of the wafer 600. In one implementation of the present embodiment, the pad oxide layer 625 is silicon dioxide ($SiO_2$) having a thickness of 10–20 nm. A barrier layer 630 is formed upon the surface of the pad oxide layer 625. In one implementation of the present embodiment, the barrier layer 630 is silicon nitride ($Si_3N_4$) having a thickness of 100–200 nm. A first resist layer 635 is formed upon the surface of the barrier layer 630. The first resist layer 635 can be any well-known liquid light-sensitive polymer.

Figure 6B:
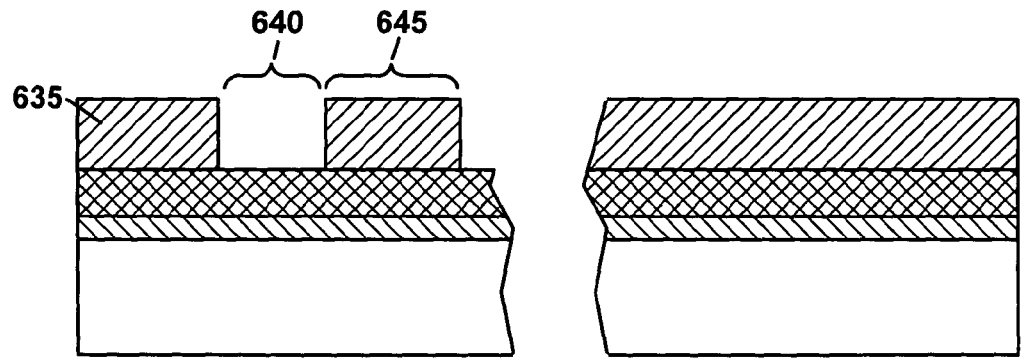

As depicted in FIG. 6B, the first resist layer 635 is patterned to define a periphery isolation region 640 and a periphery active region 645. The first resist layer 635 can be patterned by any well-known lithography process.

Figure 6C:
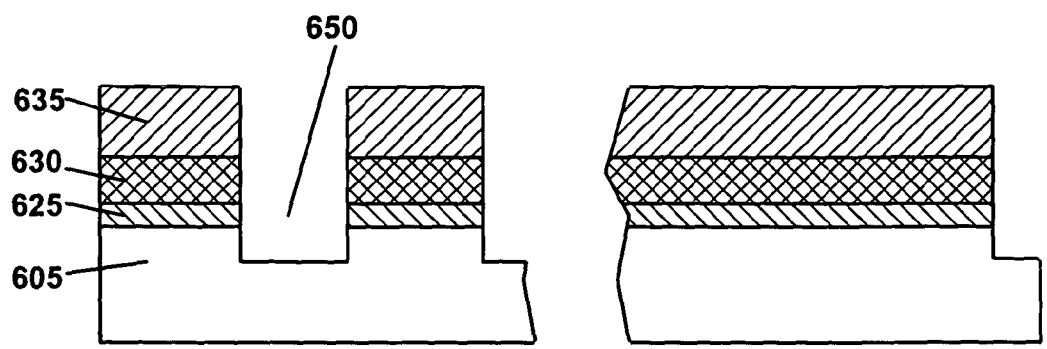

As depicted in FIG. 6C, the portions of the barrier layer 630, pad oxide layer 625, and substrate 605 left exposed by the patterned first resist layer 635 are removed to form a periphery isolation trench 650. Portions of the barrier layer 630, pad oxide layer 625, and substrate 605 can be removed by any well-known etching process. In one implementation, the resulting periphery isolation trench 650 in the wafer 605 is approximately 200–400 nm deep and 160–320 nm wide. In another implementation, the resulting periphery isolation trench 650 may be any desired depth and width.

Figure 6D:
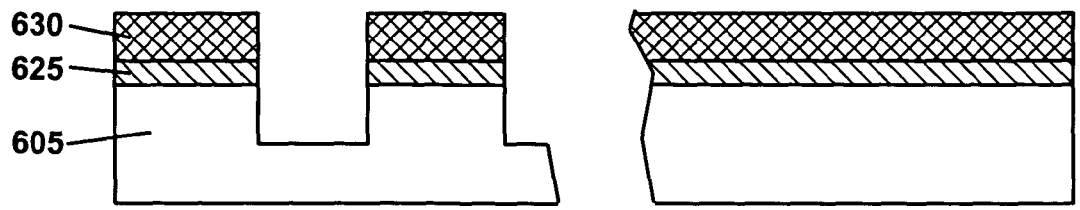

As depicted in FIG. 6D, the first resist layer 635 is removed. The first resist layer 635 can be removed by any well-known process such as resist stripping, or the like.

Figure 6E:
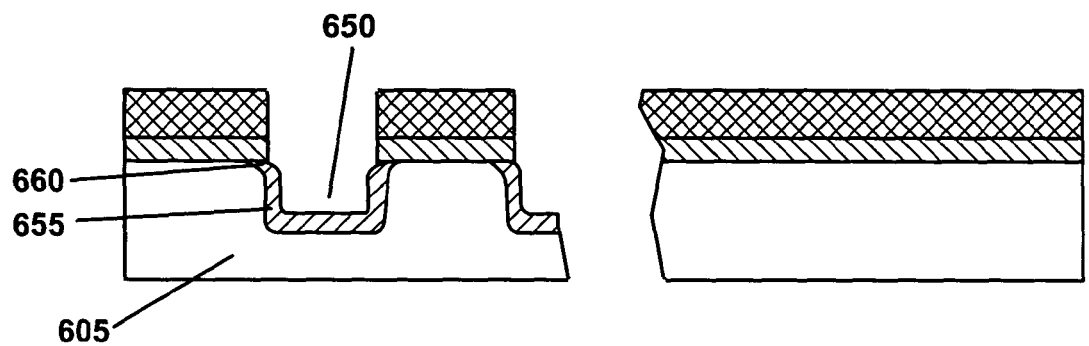

As depicted in FIG. 6E, a first liner oxide 655 is formed along the substrate 605 material bordering the periphery isolation trench 650. The first liner oxide 655 can be a dielectric formed by any well-known oxidation process. In one implementation, the first liner oxide 655 forms approximately 50% above the material 605 bordering the periphery isolation trench 650, and approximately 50% below the material 605 bordering the periphery isolation trench 650. In one implementation, the first liner oxide 655 acts to round the corners 660 of the periphery isolation trench 650. In one implementation, the substrate 605 is silicon (Si), the oxidizing agent is oxygen (O), and the resulting liner oxide 655 is silicon dioxide ($SiO_2$) having a thickness of approximately 10–20 nm. In another implementation, the first liner oxide 655 may be any desired thickness.

In a first configuration (not shown), the first liner oxide 655 is removed. The first liner oxide 655 can be removed by any well-known sacrificial oxide etching process, such as wet etching. In one implementation, the resulting isolation trench 650 will have rounded corners 660. In another implementation, the periphery trench 650 width may be approximately 10–20 nm wider, while only 5–10 nm deeper, as a result of removing the first liner oxide. Thus, the aspect ratio of the trench 650 is increased slightly. In a second configuration, the first liner oxide 655 is not removed.

Figure 6F:
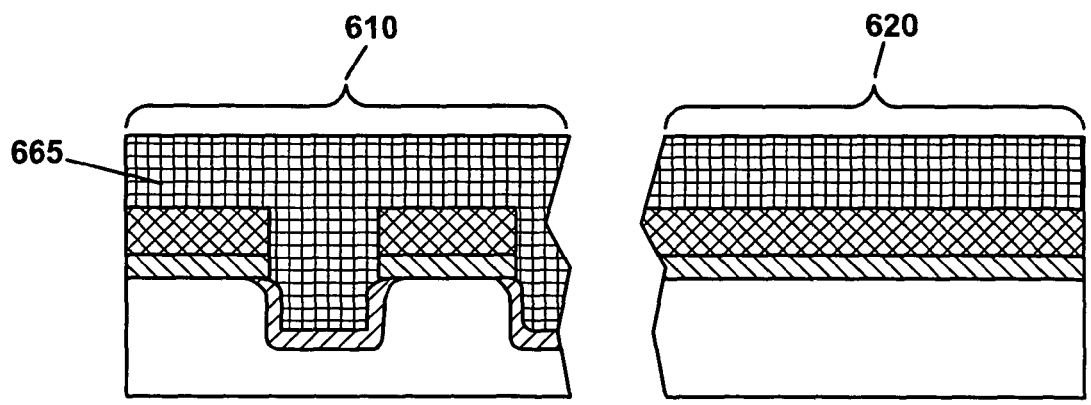

As depicted in FIG. 6F, a second resist layer 665 is formed upon the surface of the periphery region 610 and the core region 620. The second resist layer 665 can be any well-known liquid light-sensitive polymer.

Figure 6G:
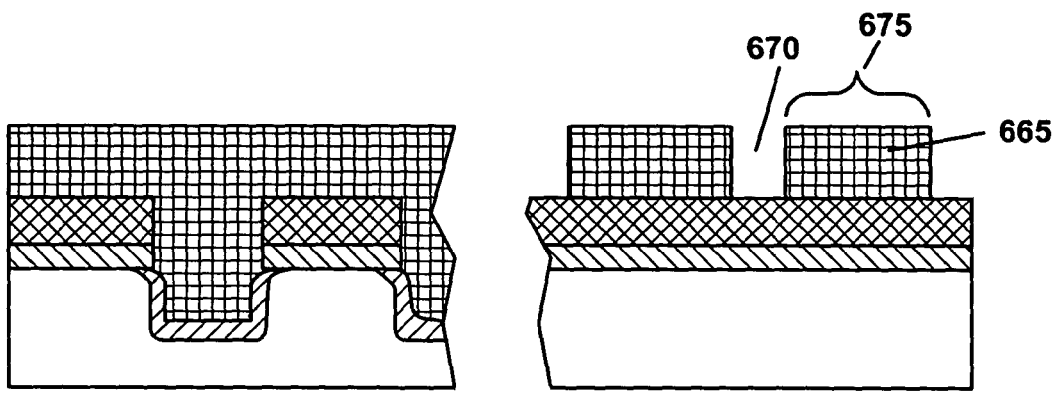

As depicted in FIG. 6G, the second resist layer 665 is patterned to define a core isolation region 670 and a core active regions 675. The second resist layer 665 can be patterned by any well-known lithography process.

Figure 6H:
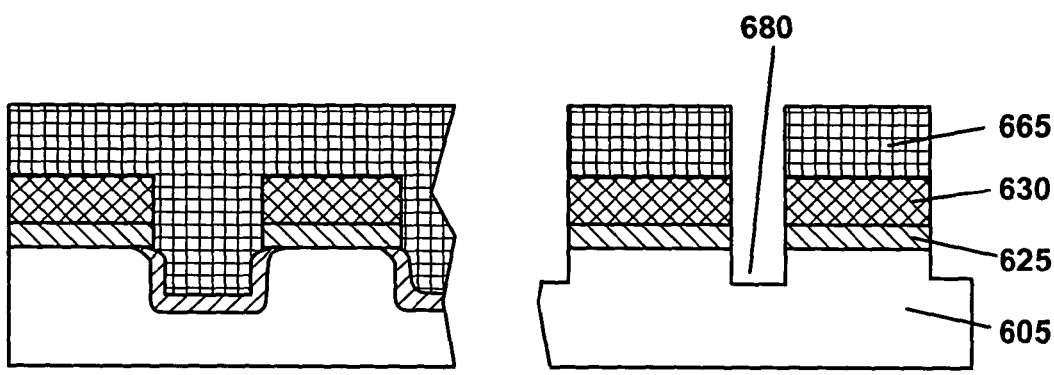

As depicted in FIG. 6H, the portions of the barrier layer 630, pad oxide layer 625, and substrate 605 left exposed by the patterned second resist layer 665 are removed to form a core isolation trench 680. Portions of the barrier layer 630, pad oxide layer 625, and substrate 605 can be removed by any well-known etching process. In one implementation the resulting core isolation trench 680 is approximately 100–200 nm deep and 70–160 nm wide. In another implementation, the resulting core isolation trench 680 may be any desired depth and width. Furthermore, the core isolation trench 680 may readily be fabricated to have a different depth than the periphery isolation trench 650.

Figure 6I:
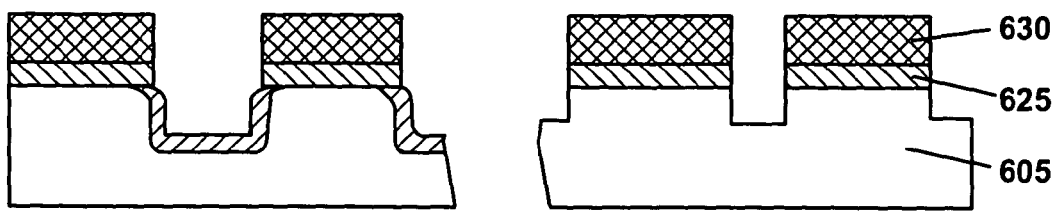

As depicted in FIG. 6I, the second resist layer 665 is removed. The second resist layer 665 can be removed by any well-known process such as resist stripping, or the like.

Figure 6J:
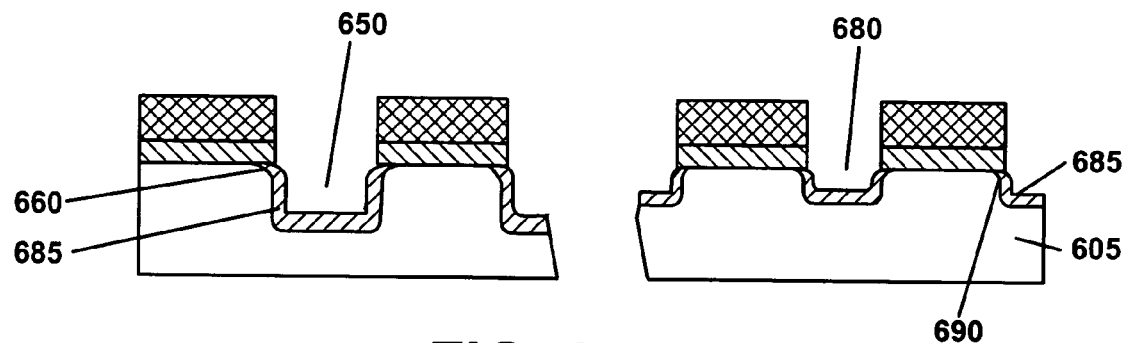

As depicted in FIG. 6J, a second liner oxide 685 is formed along the substrate 605 material bordering the core isolation trench 680 and the periphery isolation trench 650. The second liner oxide 685 can be a dielectric formed by any well-known oxidation process. In one implementation, the second liner oxide 685 acts to round the corners 690 of the core isolation trench 680. The second liner oxide 685 also acts to double round the corners 661 of the periphery isolation trench 650. In another implementation, the second liner oxide 685 acts to provide a high quality insulating dielectric. In the first configuration of the present embodiment, the second liner oxide 685 is approximately 20–40 nm thick, in both the periphery and core isolation trenches 650, 680. In the second configuration, the second liner oxide 685 is approximately 20–40 nm thick in the core isolation trench 680, and combines with the first liner oxide in the periphery isolation trench 650 to provide a total thickness of approximately 25–60 nm, or any relative combination of thicknesses.

Figure 6K:
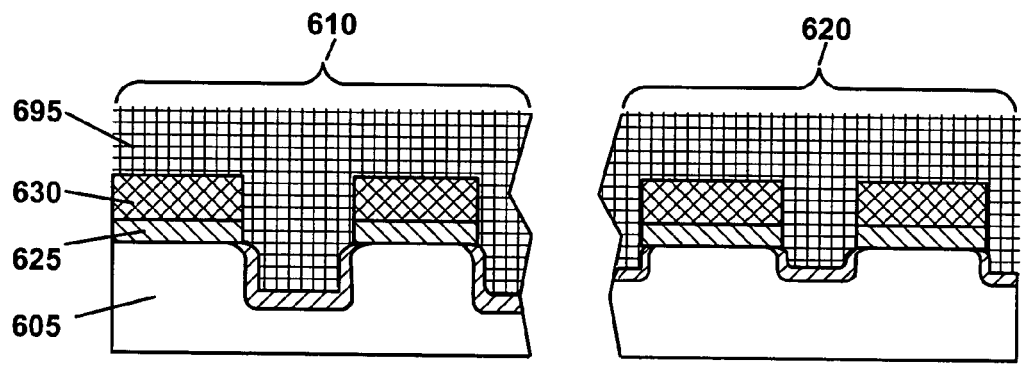

As depicted in FIG. 6K, a trench fill 695 is deposited in the periphery region 610 and the core region 620. The trench fill 695 can be formed by any well-known dielectric deposition process having good conformal coating properties. In one implementation, of the present invention, the trench fill 695 can be formed by decomposition of tetraethylorthosilicate (TEOS) deposition. In another implementation, the trench fill 695 can be formed by high density plasma (HDP) deposition.

Figure 6L:
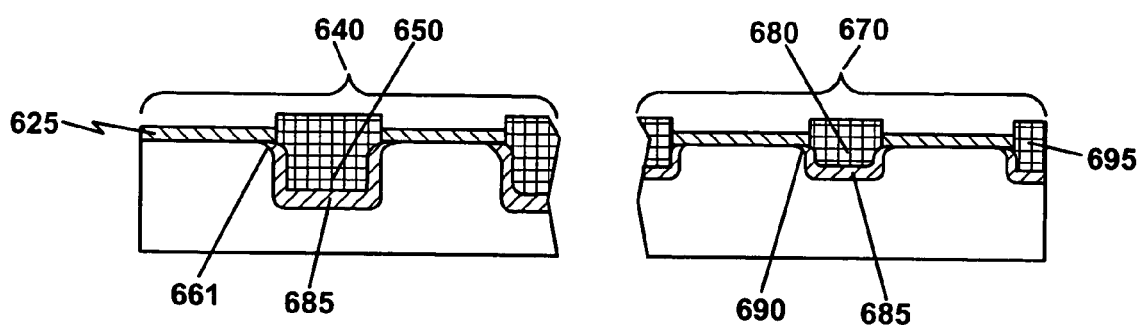

As depicted in FIG. 6L, the excess trench fill 695 and the barrier layer 630 may then be removed. The excess trench fill 695 and the barrier layer 630 can be removed by any well-known processes, such as sacrificial etching, chemical mechanical polishing (CMP), and/or the like.

As a result, the periphery isolation region 640 comprise the periphery trench 650, the first and second liner oxide 685 (or optionally just the second liner oxide) providing double corner rounding 661, and having uniform density trench-fill 695 therein. The core isolation region 670 comprise the core trench 680, the second liner oxide 685 providing corner rounding 690, and trench fill 495 having uniform density therein.

A trench fill having uniform density is difficult to obtain in conventionally formed trenches having aspect ratios of 7.0–8.0 or less. When the trench is very narrow, bubbles, holes, voids and other inconsistencies occur in the dielectric deposited in the trench. However, in one implementation the double corner rounded 661 periphery isolation trench 650 and corner rounded 690 core isolation trench 680 allows for more uniform trench filling therein. In the first configuration, removing the first liner oxide further improves uniform trench filling in the periphery trench. The resulting trench fill 695 having uniform density provides trench isolation regions 640, 670 having a good quality dielectric, which reduces leakage current effects.

In one implementation, the high quality dielectric of the second liner oxide 685 (or optionally the first and second liner oxide) further reduces leakage current. In the second configuration, the second liner oxide 685 provides a double thick high quality dielectric in the periphery trench 650. The double thick high quality dielectric layer further reduces leakage current in the periphery region 670, which typically operates at relatively high voltage levels.

In one implementation, the rounded corners 661, 690 of the periphery and core trenches 650, 680 also reduce corner effects therein. The rounded corners increases the localized area over which an electric field is distributed. Thus, reducing the chance of breakdown due to high localized electric field typically present at the corners of the periphery isolation trench 650 and the core isolation trench 680.

Figure 7A:
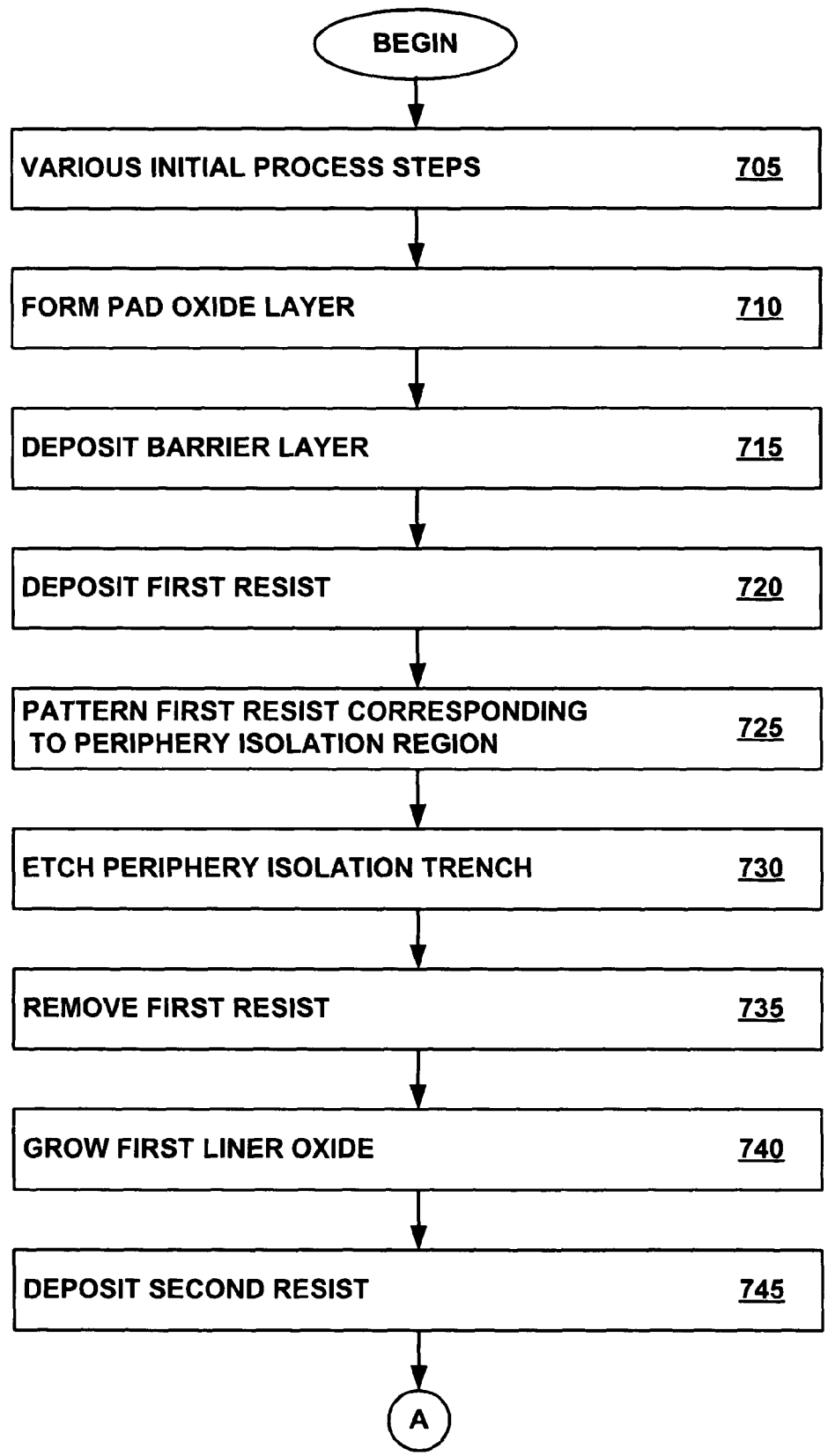
FIGS. 7A–7B show a method of fabricating a multiple trench isolation structure, according to one embodiment of the present invention.
Figure 7B:
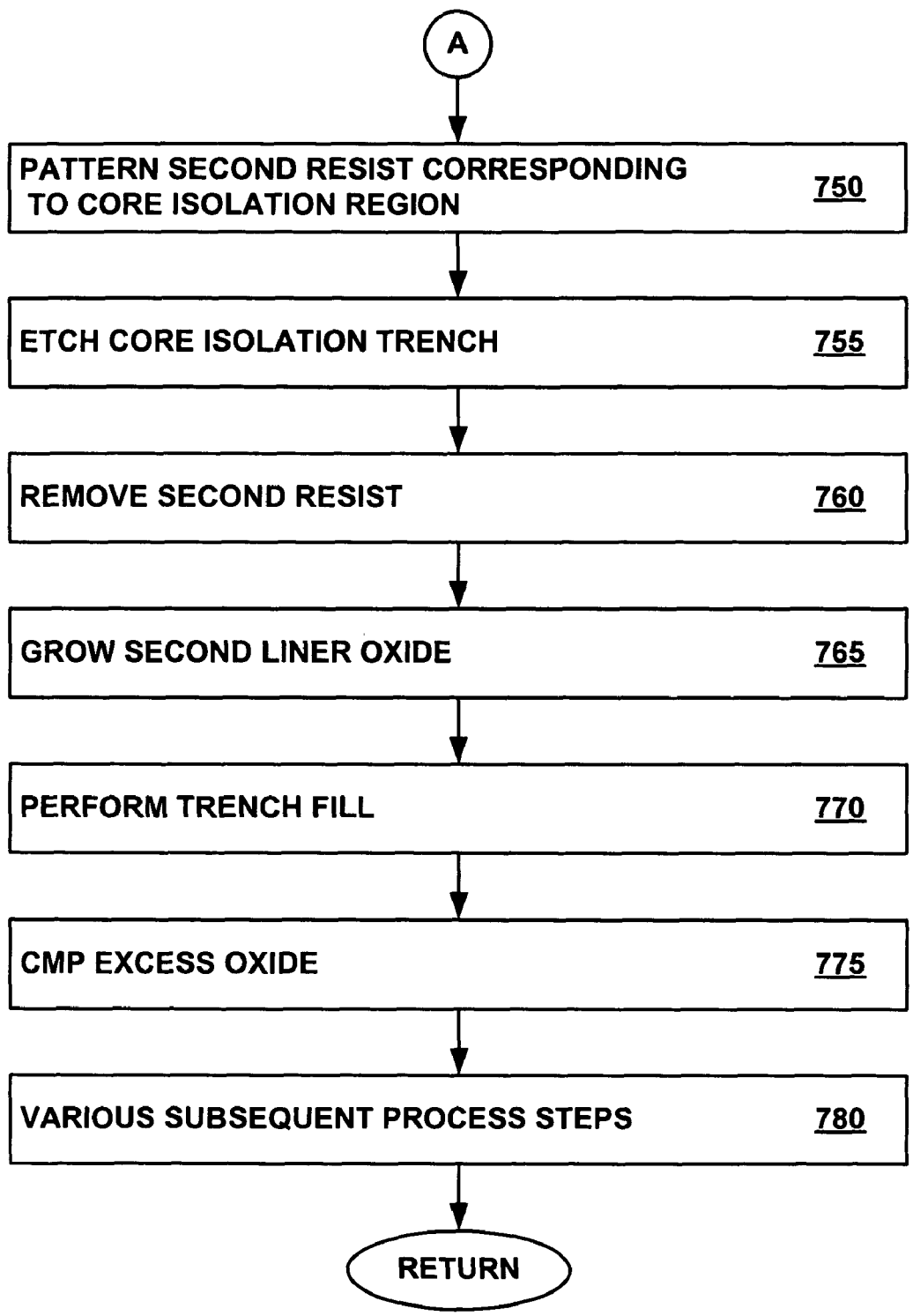

Referring now to FIGS. 7A–7B, a method of fabricating a multiple trench isolation structure, according to one embodiment of the present invention, is shown. As depicted in FIGS. 7A–7B, the process begins with various initial steps performed on a substrate, at step 705. The initial steps may include processes such as cleaning, impurity implanting, diffusion, and the like.

Next, at step 710, the present embodiment forms a pad oxide layer on the substrate. In one implementation of the present embodiment, the pad oxide can be formed by any well-known oxidation, deposition, or the like process. In one implementation of the present embodiment, the substrate is silicon (Si), the oxidizing agent is oxygen (O), and the resulting pad oxide layer is silicon dioxide ($SiO_2$), having a thickness of approximately 10–20 nm.

Next, at step 715, the present embodiment deposits a barrier layer on the pad oxide layer. In one implementation of the present embodiment, the barrier layer can be formed by any well-known deposition process, such as chemical vapor deposition (CVD), or the like. In one implementation of the present embodiment, the barrier layer is silicon nitrate ($Si_3N_4$), approximately 100–200 nm thick.

Next, at step 720, the present embodiment deposits a first resist layer on the barrier layer. The first resist can be any well-known light-sensitive polymer.

Next, at step 725, the present embodiment patterns the first resist layer based upon the desired layout of a periphery isolation region. In one implementation of the present embodiment, the first resist can be patterned utilizing any well-known lithography process.

Next, at step 730, the pad oxide layer, barrier layer, and substrate are selectively removed to form a periphery isolation trench. The pad oxide layer, barrier layer, and substrate can be selectively removed by any well-known etching process, such as dry etching, or the like. In one implementation of the present embodiment, the etching process is performed until a periphery trench having an aspect ratio of approximately 7.0–8.0 or less is formed in the substrate.

Next, at step 735, the first resist layer is removed. The first resist layer can be removed by any well-known method such as resist stripping, or the like.

Next, at step 740, a first liner oxide is grown in the periphery isolation trench. The first liner oxide can be grown by any well-known oxidation process. In one implementation, the oxidation agent reacts with and consumes the substrate material along the periphery isolation trench walls, whereby the liner oxide is formed approximately half above the original substrate surface and half below the original substrate surface bordering the periphery isolation trench. In one implementation, the first liner oxide process acts to round the corners of the periphery isolation trench. In one implementation of the present embodiment, the substrate is silicon (Si), the oxidation agent is oxygen (O), and the resulting liner oxide is silicon dioxide ($SiO_2$) having a thickness of approximately 10–20 nm. For such an oxidation process performed in a dry ambient at approximately 1000° C., it takes approximately 4–6 min to form the 10–20 nm thick first liner oxide layer of silicon dioxide.

In an optional step (not shown), the first liner oxide layer may be removed. The first liner oxide may be removed by any well-known sacrificial oxide etch process, such as wet etching. In one implementation, the resulting periphery trench will thus have rounded corners. In another implementation, removing the first liner oxide may also increase the aspect ratio of the periphery isolation trench.

Next, at step 745, the present embodiment deposits a second resist layer on the surface of the periphery region and core region. The resist can be any well-known light-sensitive polymer.

Next, at step 750, the present embodiment patterns the second resist layer based upon the desired layout of a core isolation region. In one implementation, the resist can be patterned utilizing any well-known lithography process.

Next, at step 755, the pad oxide layer, barrier layer, and substrate are selectively removed to form a core isolation trench. The pad oxide layer, barrier layer, and substrate can be selectively removed by any well-known etching process, such as dry etching, or the like. In one implementation of the present embodiment, the etching process is performed until a core isolation trench having an aspect ratio of approximately 7.0–8.0 or more is formed in the substrate.

Next, at step 760, the second resist layer is removed. The second resist layer can be removed by any well-known method such as resist stripping, or the like.

Next, at step 765, a second liner oxide is grown. The second liner oxide can be grown by any well-known oxidation process. In one implementation of the present embodiment, the oxidation agent reacts with and consumes the substrate material along the periphery isolation trench walls and the core isolation trench walls, whereby the liner oxide is formed approximately half above the original substrate surface and half below the original substrate surface bordering the periphery isolation trench and the core isolation trench. In one implementation, the second liner oxide process acts to round the corners of the core isolation trench. The second liner oxide process also acts to further round the corners of the periphery isolation trench. In one implementation of the present embodiment, the substrate is silicon (Si), the oxidation agent is oxygen (O), and the resulting second liner oxide is silicon dioxide ($SiO_2$).

The second liner oxide can be approximately 20–40 nm in the core isolation trench and approximately 25–60 nm in the periphery isolation trench. For such an oxidation process performed in a dry ambient at approximately 900–1100° C. In one implementation, the second liner oxide layer combines with the first liner oxide layer in the periphery region in order to provide the 25–60 nm thick layer. Thus, no additional time is required to provide a double thick liner oxide layer in the periphery trench. If the optional step of removing the first liner oxide is performed, the second liner oxide can be approximately 20–40 nm thick in both the periphery and core isolation trenches.

Next, at step 770, a dielectric trench fill process providing good conformal coverage is performed. The rounded trench corners provided by steps 740 and/or 765 result in the dielectric as deposited having substantially uniform density. The trench fill process can be any well-known dielectric deposition process, such as TEOS, HDP, or the like.

Next, at step 775, excess dielectric material deposited by the trench fill process is removed. In one implementation of the present embodiment, the excess dielectric material can be removed by any well-known CMP process.

Finally, at step 780, fabrication proceeds with various other subsequent processing steps. The subsequent processing steps may include processes such as etching, impurity implanting, diffusion, deposition, etching, metalization, passivation, cleaning, polishing, and/or the like.

In one implementation, the first and second liner oxide material are comprised of a high quality dielectric material, as compared to the trench fill material. Therefore, the first and/or second liner oxide layers provide for increased electrical isolating qualities of the core and periphery isolation regions. Furthermore, the second liner oxide layer combines with the first liner oxide layer in the periphery trench, thereby increasing the electrical isolating properties of the periphery isolation region. However, the total time required for forming the double thick liner oxide in the periphery trench requires less time than separately forming the two liner oxide-layer according to the conventional art. The additional time required in the conventional art, to form both oxide layer separately, thus adds to the total cost of manufacturing such integrated circuits.

In one implementation, the first and second liner oxide layers are also utilized to round the corners of the dual trench structure, thereby reducing corner effects. Such corner effects can result in degraded performance and/or device failure within the integrated circuit.

In one implementation, the rounded corners of the trenches also allow for depositing trench fill having substantially uniform density in trenches with aspect ratios of less than approximately 7.0–8.0. If the first liner oxide is removed prior to forming the second liner oxide, in one implementation the first liner oxide also acts to slightly enlarge the aspect ratio of the core isolation trench. Thus, further enhancing the ability to deposit trench fill having substantially uniform density in the core isolation trench. The resulting trench fill, having a uniform density, improves the insulating qualities of the dielectric material. In another implementation, the substantially uniform density of the as deposited dielectric may also reduce or eliminate the need for a trench fill densification process.

In the conventional art method, a trench fill densification process typically entails a thermal anneal process in which the wafer is subjected to an elevated temperature for a period of time (e.g., 1000° C. or more, for approximately 1–3 h). The thermal anneal process used in the conventional art methods is disadvantageous in that the extra process and the additional time required increases the manufacturing costs. Furthermore, the elevated temperature utilized in the thermal anneal can result in undesirable diffusion of impurities, thus effecting doping profiles.

The above-described dimensions, including depth, width, thickness, and the like, are exemplary. As device fabrication techniques improve it is appreciated that such dimension will continue to be reduced. The various embodiments of the present invention are readily adaptable to such changes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of fabricating a flash memory comprising:
   forming a first trench in a first region, wherein said first trench has a first depth;
   forming a first liner oxide in said first trench;
   forming a second trench in a second region subsequent to said forming said first liner oxide, wherein said second trench has a second depth, wherein said second depth is not equal to said first depth;
   removing said first liner oxide;
   subsequent to said removing said first liner oxide, forming a second liner oxide in said first trench and said second trench, wherein said second liner oxide provides for corner rounding of said second trench and double corner rounding of said first trench; and
   depositing a dielectric in said first trench and said second trench.

2. The method according to claim 1, wherein said removing said first liner oxide increases an aspect ratio of said first trench.

3. The method according to claim 1, wherein said removing said first liner oxide provides for said dielectric having substantially uniform density.

4. The method according to claim 1, wherein said first liner oxide provides for corner rounding of said first trench.

5. The method according to claim 4, wherein said corner rounding of said first trench provides for said dielectric having substantially uniform density.

6. The method according to claim 4, wherein said corner rounding of said first trench reduces corner effects of said first trench.

7. The method according to claim 1, wherein said double corner rounding of said first trench reduces corner effects of said first trench, and said corner rounding of said second trench reduces corner effects of said second trench.

8. The method according to claim 1, wherein said first region is a core region and said second region is a periphery region.

9. The method according to claim 1, wherein said first region is a periphery region and said second region is a core region.

10. A method of fabricating a memory device comprising:
    etching a core trench to a first depth;
    oxidizing a substrate material proximate said core trench, wherein a first liner oxide layer is formed;
    etching a periphery trench to a second depth subsequent to oxidizing said substrate material proximate said core trench, wherein said first depth and second depth are different;
    removing said first liner oxide layer;
    subsequent to said removing said first liner oxide, oxidizing said substrate material proximate said core trench and said periphery trench, wherein a second liner oxide layer is formed and wherein a corner of said core trench is rounded and a corner of said periphery trench is double rounded; and
    depositing a trench fill in said core trench and said periphery trench.

11. The method according to claim 10, wherein said corner rounding of said core trench provides for reducing a thickness of said second liner oxide.

* * * * *